United States Patent
Berasi et al.

(10) Patent No.: US 7,077,974 B2
(45) Date of Patent: Jul. 18, 2006

(54) FINE-DIMENSION MASKS AND RELATED PROCESSES

(75) Inventors: Peter Berasi, Hopewell Junction, NY (US); Michael Jerome, Kingston, NY (US); Doris Pulaski, Holmes, NY (US); Robert Rippstein, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 10/250,044

(22) Filed: May 30, 2003

(65) Prior Publication Data
US 2004/0238491 A1 Dec. 2, 2004

(51) Int. Cl.
*C23F 1/00* (2006.01)

(52) U.S. Cl. .................. 216/84; 216/41; 216/83; 216/100; 430/5; 430/312; 430/313; 428/137

(58) Field of Classification Search ............. 216/41, 216/83, 84, 100; 430/5, 312, 313; 428/137
See application file for complete search history.

(56) References Cited

U.S. PATENT DOCUMENTS

| | | | |
|---|---|---|---|
| 5,221,421 A * | 6/1993 | Leibovitz et al. ............. 216/48 |
| 5,266,152 A * | 11/1993 | Iwasaki et al. ............... 216/85 |
| 5,518,131 A * | 5/1996 | Chen et al. .................. 216/100 |
| 5,744,214 A | 4/1998 | Berasi et al. |
| 5,846,628 A * | 12/1998 | Kuroe et al. ............... 428/65.3 |
| 5,858,257 A * | 1/1999 | Naitoh ......................... 216/92 |
| 5,879,465 A * | 3/1999 | McKevitt et al. .............. 134/3 |
| 6,444,589 B1 * | 9/2002 | Yoneya et al. .............. 438/745 |
| 2003/0064521 A1 * | 4/2003 | Lu et al. ....................... 436/55 |

* cited by examiner

*Primary Examiner*—Shamim Ahmed
(74) *Attorney, Agent, or Firm*—DeLio & Peterson, LLC; Kelly M. Nowak; Ira D. Blecker

(57) ABSTRACT

A method of making, and the resultant mask, comprises developing resist layers over surfaces of a masking layer to transfer significantly reduced sized openings within glass masters attached to the surfaces of the masking layer into the resist layers. These significantly reduced sized openings within the resist layers are then transferred into the masking layer within a first etch bath by simultaneously monitoring and controlling both etchant activity and concentration of a byproduct within the etch bath formed between the masking material and the etchant. The openings may be etched to completion within the first etch bath, or alternatively, the openings may be etched to a pre-finished image size. Wherein the openings are etched to a pre-finished image size, the masking layer is immersed into a second etch bath for further micro-etching of these openings to a final desired image size.

23 Claims, 5 Drawing Sheets

FINE-DIMENSION MASKS AND RELATED PROCESSES

BACKGROUND OF INVENTION

1. Field of the Invention

The present invention relates to manufacturing masks for the formation of semiconductor substrates and ceramic interconnect packaging substrates, in particular, to methods of making fine geometrical dimension masks for deposition of electrically conductive materials on preselected areas of the substrates.

2. Description of Related Art

In the formation of integrated circuits, masks are used for forming electrically conductive features on a semiconductor substrate or in Integrated Circuit (IC) packaging. A mask is a layer of material having openings or vias therein, whereby the mask is held over at least one surface of the substrate for forming these electrically conductive features on the substrate surface. These openings or vias in the mask define a desired circuit, IC package or other conductive surface features.

Masks are commonly used for sputter, evaporative deposition or screening of a conductive material within features created in the mask corresponding to preselected areas of the substrates. For instance, masks may be used to form input/output (I/O) sites or conductive lines on the substrate surface. In formation of I/O sites, the mask is typically an evaporation mask whereby conductive material is sputter or evaporative deposited within features in the mask corresponding to sites on the substrate where such I/O sites are to be formed. A conductive metal layer is often sputtered or evaporated within these openings or vias to form electrically conductive solder bump flip chip connections, such as controlled-collapse chip connections (C4). In the formation of conductive lines, a conductive material, such as a conductive paste, is screened within features in the mask corresponding to sites on the substrate where these lines are to be formed. Typically, these conductive pastes are screened into the openings in the mask to form multi-layer ceramic (MLC) packages.

Yet, in accordance with current semiconductor technology, the methods of forming such masks, and the resultant masks formed, are limited in both size and feature dimensions of the openings or vias formed therein. That is, current technology sets dimensional limits on the achievable geometrical dimensions of electrically conductive features formed within current technology masks that enable the production of effective and efficient semiconductor technology and IC packaging.

As semiconductor technology continues to proliferate, future generations of smaller, faster semiconductor technology and IC packaging will require masks imaged with smaller and denser features that will enable the achievement of these future generations of technology.

In view of the foregoing, a need therefore exists in the art to provide improved masks having significantly reduced geometrical dimensions for forming electrically conductive features within such masks that will accommodate future generations of semiconductors or integrated circuits.

SUMMARY OF INVENTION

Bearing in mind the problems and deficiencies of the prior art, it is therefore an object of the present invention to provide improved methods of making masks having fine geometrically dimensioned openings therein for forming fine electrically conductive features on a substrate having significantly reduced geometrical dimensions for use in future generations of technology.

Another object of the present invention is to provide improved methods of making a fine pitch mask and the resultant mask made by such process.

It is another object of the present invention to provide fine pitch masks having significantly reduced geometrical dimensions for depositing electrically conductive bumps also having significantly reduced geometrical dimensions.

A further object of the invention is to provide a method of reducing I/O pitch and related geometries in masks used to create future generations of integrated circuits.

Still another object of the invention is to provide improved methods of making a fine line mask and the resultant mask made by such process.

Another object of the present invention is to provide fine line masks having significantly reduced geometrical dimensions for depositing electrically conductive lines also having significantly reduced geometrical dimensions.

Yet another object of the invention is to provide a method of significantly reducing line geometries in masks used to create future generations of integrated circuit packaging.

Still other objects and advantages of the invention will in part be obvious and will in part be apparent from the specification.

The above and other objects and advantages, which will be apparent to one of skill in the art, are achieved in the present invention, which, is directed to in a first aspect a method of forming a mask for deposition of electrically conductive materials-in a desired pattern on areas of a substrate. The method includes providing a masking layer comprising a material and then etching the masking layer within a first etch bath using an etchant to form at least one opening within the masking layer, whereby the material and the etchant react to form a byproduct within the first etch bath. This at least one opening represents the pattern on areas of the substrate and the opening is of a significantly reduced size. In forming these openings, during this etching step a concentration of the byproduct formed in the first etch bath is monitored and controlled in order to control etching of the at least one opening in the masking layer to form the resultant mask. Further, in forming these openings, the activity of the etchant is simultaneously monitored and controlled during this etch step in the first etch bath.

Preferably, prior to providing the masking layer into the first etch bath, the etch bath is activated. This is done by adding a sufficient amount of additional material the masking layer comprises in order to form an initial concentration of the byproduct within the first etch bath. The initial concentration of the byproduct is then monitored and controlled while simultaneously monitoring and controlling the etchant activity. The etchant activity includes monitoring and controlling properties of the first etch bath including an etch bath metal concentration, oxidation/reduction potential, temperature and pH. More preferably, the temperature is maintained and controlled to a range from about 128° F. to about 133° F., while the pH is maintained and controlled to a range from about 12.0 pH to about 12.8 pH.

The first aspect of the invention further includes providing a first and a second resist layer over a first and a second surface of the masking layer. First and second glass masters are then secured to the first and second surface of the masking layer respectively. These glass masters each have at least one opening therein of significantly reduced size, whereby these glass masters are aligned so that the openings in the glass master attached to the front of the masking layer are aligned with the openings in the second glass master attached to the back of the masking layer. These openings of significantly reduced size in the glass masters are then transferred into the first and second resist layers by exposing and developing the resist layers. The openings in the first and second glass masters may be the same sizes or different sizes.

After the resist layers are developed, the glass masters may be removed and the masking layer having developed resist over surfaces thereof may be provided within the first etch bath. The significantly reduced size openings within the resist layers are then transferred into the masking layer by etching thereof for an extended time while controlling the concentrations of the byproduct within the first etch bath to form the openings therein the masking layer to completion, or to a final image size, thereby preferably providing a screening mask.

Alternatively, this first bath may be an initial coarse etch step for forming openings in the masking layer of a pre-finished image size dimension. In this aspect of the invention, the masking layer is removed from the first etch bath, the resist layers removed from the masking layer surfaces and then the pre-finished mask having pre-finished size openings is provided within a second etch bath for further micro-etching. This second etch bath fine-tunes the pre-finished size openings down to a final image size of the openings to form the mask, preferably an evaporation mask.

In yet another aspect, the invention is directed to a method of forming a mask for deposition of electrically conductive materials in a desired pattern on areas of a substrate whereby the masking layer comprises molybdenum. First and second surfaces of the molybdenum masking layer are respectively provided with patterned first and second resist layers, each having a plurality of openings therein of significantly reduced geometrical dimensions. Preferably, these resist layers are uniformly deposited over the surfaces of the molybdenum masking layer by substantially immediately drying the resist layers after deposition thereof. The molybdenum masking layer is etched in a first etch bath whereby a byproduct is formed between the molybdenum masking layer and an etchant therein the etch bath. A concentration of this byproduct is monitored and controlled within the first etch bath while simultaneously monitoring and controlling activity of the etchant. This regenerates the first etch bath in-situ for transferring the plurality of openings of significantly reduced geometrical dimensions from the resist layers into the molybdenum masking layer while maintaining any knife-edges within the openings. These openings of significantly reduced geometrical dimensions in the molybdenum masking layer represent the pattern on areas of the substrate to form the mask. The openings may include vias, I/Os, lines, channels or combinations thereof.

Preferably, the etchant comprises potassium ferricyanide with sodium hydroxide and the byproduct comprises potassium sodium molybdate monitored and controlled to concentrations ranging from about 25 grams/liter to about 33 grams/liter. More preferably, the activity of the potassium ferricyanide with sodium hydroxide etchant is monitored and controlled by monitoring and controlling a total iron concentration within the etch bath to a range from about 25 grams/liter to about 30 grams/liter while simultaneously monitoring and controlling an oxidation/reduction potential and a pH of the first etch bath.

This first etch bath may etch the openings within the masking layer to completion, or alternatively, the openings may be etched to a pre-finished image size. Wherein the openings are etched to a pre-finished image size, the molybdenum masking layer is removed from the first etch bath, the resist layers removed and then the molybdenum masking layer is fully immersed into a second etch bath for further micro-etching of these pre-finished openings to completion. Preferably, the etchant in the second etch bath comprises an aqueous solution of sodium persulfate and sodium hydroxide.

In still another aspect, the invention is directed to a mask comprising a masking layer having a plurality of openings traversing there through, each with significantly reduced geometrical dimensions and knife-edges extending into a center of the openings. The masking layer may comprise molybdenum, tungsten, niobium, stainless steel, alloys or combinations thereof, while the openings may include vias, I/Os, lines, channels or combinations thereof. Wherein the openings are I/Os, each one preferably has a diameter of about 2.0 mil with a pitch of about 6.0 mil. Wherein the openings are line openings, each one preferably has a diameter as low as about 68 μm. The mask may include an evaporation mask, a screening mask or a stencil.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

Figure 1:
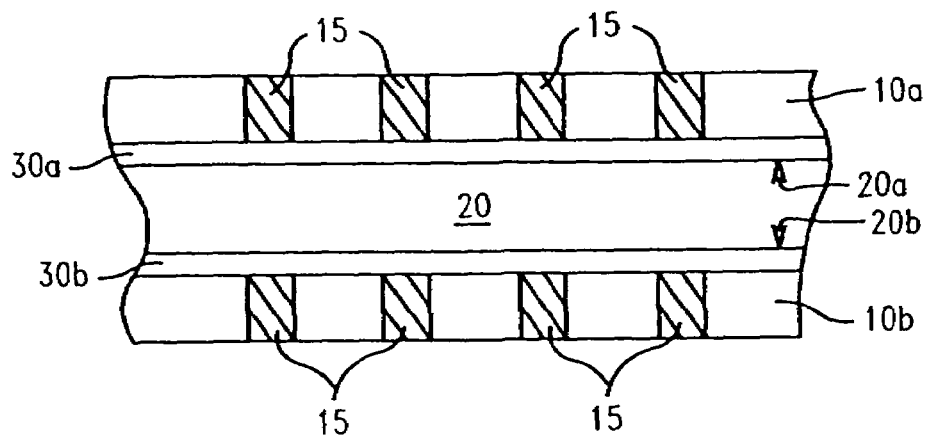
FIG. 1 is a side elevational view illustrating a masking layer with glass masters having equal sized openings of the reduced geometries of the invention on both sides thereof, wherein the openings represent geometrical apportionments of lines, vias, I/O's or other functional circuit pattern element.

In describing the preferred embodiment of the present invention, reference will be made herein to FIGS. 1–6 of the drawings in which like numerals refer to like features of the invention. Features of the invention are not necessarily shown to scale in the drawings.

The present invention is directed to masks, and formation thereof, for use in deposition of electrically conductive materials onto areas of a substrate. The masks are provided with openings of fine geometrical dimensions, those of which are substantially smaller in comparison to current geometries of mask openings, for use in semiconductor and IC fabrication. In forming the smaller openings of the invention, a critical aspect of the invention is that a masking layer be etched using an etchant whereby a byproduct concentration formed between reaction of the material of the masking layer and the etchant is monitored and controlled along with simultaneously monitoring and controlling activity of the etchant. The invention enables the achievement of significantly smaller sized features within masks for use in forming future generations of smaller, faster semiconductor and IC technology.

Figure 2:
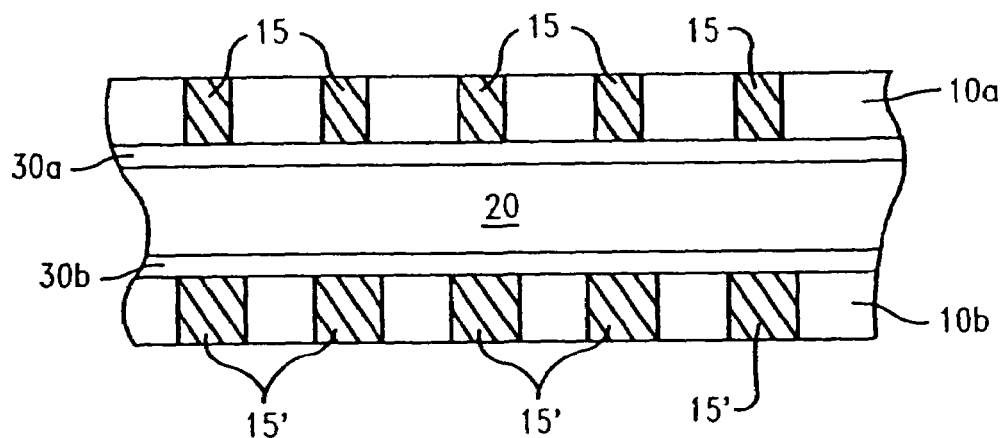
FIG. 2 is a side elevational view illustrating a masking layer with glass masters having openings of the reduced geometries of the invention whereby one glass master has smaller sized openings than the other glass master.

Referring to FIGS. 1–6, in forming the masks 100, 200 of the invention, a critical component of the invention is that glass masters used in forming the smaller openings of the invention within masks 100, 200 be uniquely modified. As shown in FIGS. 1 and 2, the glass masters 10a,b are uniquely modified by significantly reducing feature size dimensions of openings 15 within the glass masters, in comparison to standard practices. Preferably, the glass masters 10a,b are provided with these significantly reduced openings 15 by modification of standard windage calculations dependent upon thickness of the masking layer employed for formation of masks 100, 200, typically via laser writing using a high resolution laser plotter (not shown) capable of forming these openings 15 within the glass masters.

The reduction in opening size in the glass masters 10a,b enables the formation of significantly reduced geometries of electrically conductive sites formed on the resultant masks 100, 200 for use in future generations of semiconductor technology by allowing for increased precision in determining a finished etched dimension or size during etching of openings 25 in the masking layer 20 to result in masks 100, 200. This advantageously allows for a reduction in mask-to-mask variation in comparison to conventional methods of mask fabrication having openings with conventional geometries. The uniquely modified glass masters 10a,b also serve to extend the length of the final mask etching cycle so as to reduce the accuracy required in the etch process termination to allow more aggressive designs to be configured in the finished metal masks as compared to standard procedures.

A masking layer 20 is used to form the masks 100, 200 of the invention. Masking layer 20 may comprise a material including, but not limited to, molybdenum, tungsten, niobium, stainless steel, and the like. Preferably, the masking layer 20 comprises a molybdenum foil layer. A photo resist layer 30 is then deposited over surfaces of the masking layer. In depositing the photo resist layer over the masking layer 20, the photo resist is conformally applied over both front 20a and back 20b surfaces of the masking layer 20.

Once the masking layer is provided with photo resist on both sides thereof, the glass masters 10a,b having openings 15 therein are then attached to the front and back surfaces of the masking layer having photo resist within holder 40. Preferably, the glass masters 10a,b are attached to the masking layer having photo resist on both sides thereof using alignment aids or verniers positioned directly onto the glass masters in order to align the first and second glass masters 10a,b on front and back surfaces of the masking layer. These glass masters 10a,b may have significantly reduced size openings 15 of the same size in each the first glass master 10a attached to the front 20a of the masking layer and the second 10b glass master attached to the back 20b of the masking layer as shown in FIG. 1 Alternatively, the significantly reduced size openings 15 in the first glass master 10a may be of different sizes from the openings 15' in the second glass master 10b as shown in FIG. 2.

Once the glass masters are attached to the masking layer, the photo resist layers 30a,b on the front and back surfaces of the masking layer 20 are then exposed and developed in order to transfer the reduced size opening 15 features within the uniquely modified glass masters 10a,b into the photo resist layers on front and back surfaces of the masking layer. As a result, photo resist layer 30a on the front 20a surface of the masking layer is provided with substantially the same size opening 15 as in the glass master 10a on such front surface 20a, while the photo resist layer 30b on the back 20b surface of the masking layer is provided with substantially the same size opening 15" as in the glass master 10b on such back surface. The glass masters 10a,b may then be removed or detached from the masking layer having patterned resist on its surfaces to allow the develop process to proceed.

The masking layer 20 having the patterned resist 30a,b on both surfaces thereof is then directly transferred into a first etch bath 50 in order to transfer the reduced size openings 35 of the resist layers 30a,b into the masking layer 20. In so doing, the masking layer 20 is etched in the etch bath 50 using an etchant chemistry that is compatible with the masking layer 20 so as to transfer the reduced sized openings 35 of the resist layers into the masking layer to form the significantly reduced size openings 25 within the masking layer 20. The conditions within etch bath 50 include a temperature ranging from about 128+ F. to about 133° F., more preferably at about 130° F., and a pH ranging from about 12.0 to about 12.8, more preferably at about pH of about 12.5. This etch bath 50 may include a single etchant or a complex of etchants that are delivered to the masking layer 20 on both surfaces thereof by uniform flooding of the front and back surfaces of the masking layer with the etchant(s).

In etching openings 25 into masking layer 20 to form the resultant mask, once the masking layer 20 is provided within the etch bath 50, the invention monitors and controls etchant activity to within set limits by simultaneously monitoring and controlling a variety of etchant features during etching, including but not limited to, total iron concentration, Oxidation/Reduction Potential (ORP), pH and the like. Further, while the etchant activity is being controlled and monitored, an etchant byproduct within the etch bath 50 is simultaneously monitored and controlled to within limits. That is, once the masking layer 20 is provided within the etch bath 50, the complex of etchants therein react with the materials of the masking layer 20 to form a byproduct complex. Conventional practice is to ignore this byproduct complex and perform etching of the masking layer without reference to the concentration of the byproduct complex. However, it has now been recognized that by doing so, this results in a significant variation in etch rate with consequent wide variation in the dimensional attributes of the finished masks.

Thus, in accordance with the invention it has unexpectedly been found that by controlling this byproduct complex within the etch bath, to within limits or concentrations, in combination with monitoring and controlling etchant activity, etch consistency of the masking layer 20 is maintained for forming resultant masks 100, 200 having the significantly reduced openings therein, while preferably maintaining any knife-edges of such openings. An essential feature in forming masks 100, 200 is that the etch bath 50 be activated by adding a sufficient amount of additional material that the masking layer is composed of to form initial masking-material/etchant byproduct complex within the bath and set it to within the desired limits or concentrations, while simultaneously measuring and controlling the etchant activity prior to introducing the masking layer 20 into the etch bath 50.

A further critical feature of the invention is that the masking layer 20 is provided within the etch bath 50 and etched for an extended time, that which is substantially greater than conventional etch times as determined by conventional image size to mask thickness relationships. That is, typical etch times for etching conventional sized openings into a masking layer are determined by the proportional relationship between the conventional image size to the thickness of the masking layer. It is common practice to keep these conventional etch times to a minimum in order to retain the efficiency of the mask manufacturing process. However, it has now been found in accordance with the invention that by significantly extending the etch time within the etch bath 50, such as to etch times ranging from about 25% to about 65% greater than conventional etch times based on the proportional relationship between the conventional image size to the thickness of the masking layer, the masking layer 20 may be provided with the smaller sized openings 25 to form the resultant masks 100, 200 of the invention. For example, wherein the masking layer comprises a molybdenum masking layer having a thickness of about 3 mils, the conventional etch time for forming conventional sized openings therein ranges from about 20 minutes to about 22 minutes. However, in accordance with the invention, it has now been found that etching a molybdenum masking layer 20 having a thickness of about 3 mils within etch bath 50 for a time ranging from about 28 minutes to about 33 minutes, in combination with monitoring and controlling etchant activity and a masking-material/etchant byproduct complex within the etch bath, provides the openings 25 of fine geometrical dimensions that represent a desired design feature within the molybdenum masking layer to result in the masks of the invention.

Figure 3:
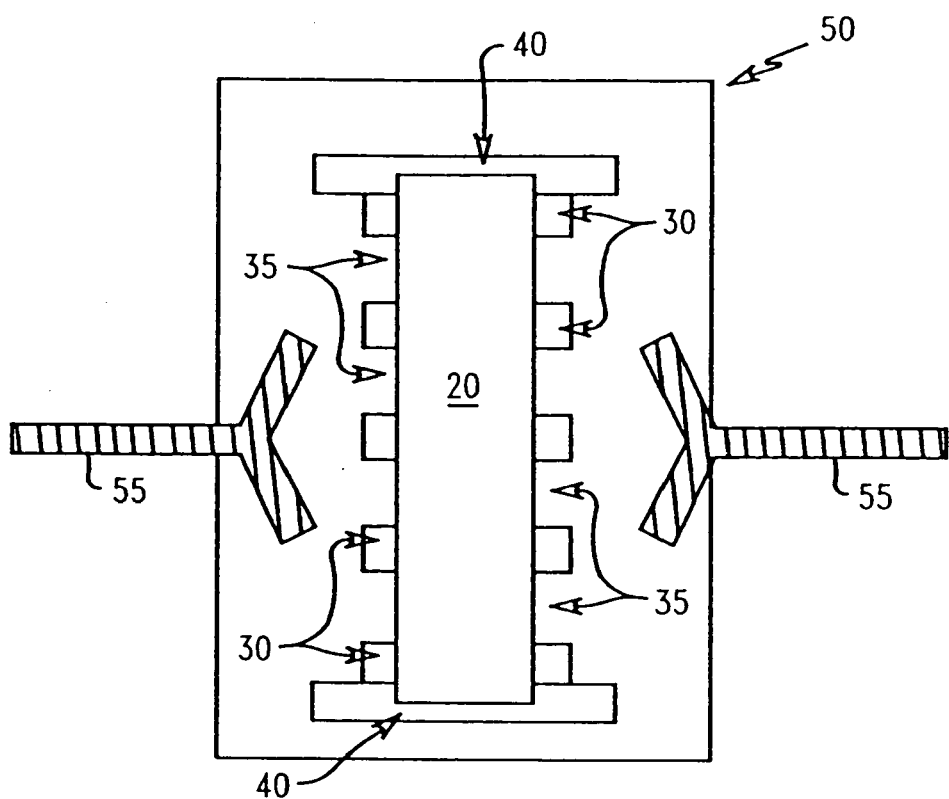
FIG. 3 is a side elevational view illustrating the masking layer of the invention within a first etch bath for a two-sided etch process.
Figure 4:
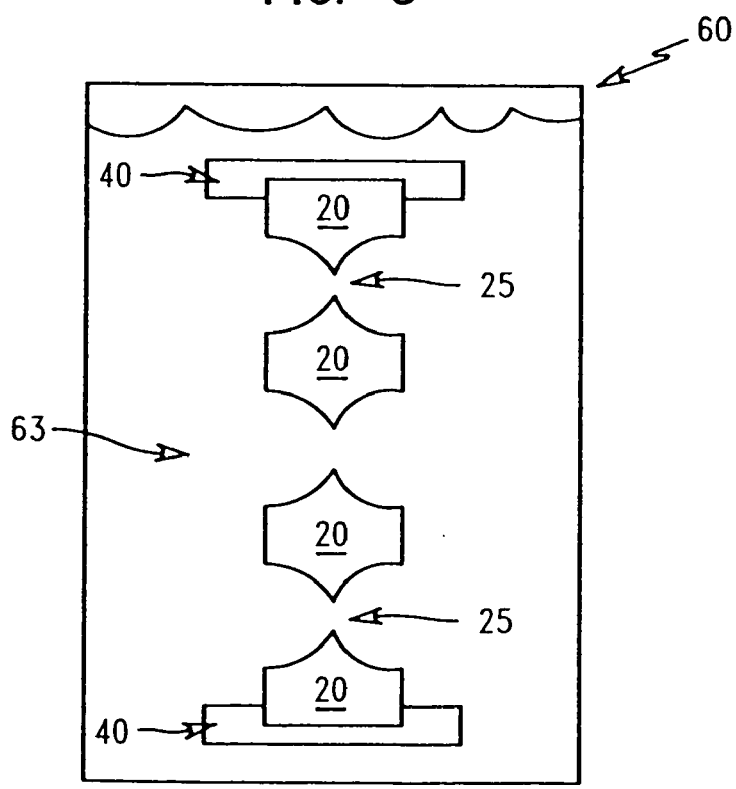
FIG. 4 is a side elevational view illustrating a second etch bath whereby the masking layer may be initially coarsely etched in the first etch bath of FIG. 3 and subsequently micro etched in the etch bath shown in the foregoing figure in order to fine tune the openings formed in the masking layer in the initial coarse etch bath.

In accordance with the invention, the etching of the masking layer 20 in etch bath 50 of FIG. 3 may etch the openings 25 therein to completion for formation of the resultant mask. Alternatively, the above etch process within the etch bath 50 may be an initial etch step that coarsely etches the openings 25 therein the masking layer, followed by further fine-etching within a second etch bath 60 as shown in FIG. 4. In this alternate embodiment, the masking layer is moved to the second etch bath 60, after the developed photo resist layers are removed, for further fine-etching the coarse openings 25 to completion by immersing the masking layer 20 with coarsely etched openings 25 into an etchant solution 63 in order to form the resultant mask of the invention.

The instant invention will be better understood in accordance with the descriptions of preferred embodiments as set forth below. However, as will be recognized by one skilled in the art, these embodiments in no manner limit the scope of the foregoing invention. This invention can be employed in the formation of a variety of masks of differing materials that require significantly reduced size openings therein for forming future generations of smaller and faster semiconductor technology.

In the preferred embodiment, masking layer 20 comprises molybdenum for the formation of a variety of different types of molybdenum masks, including but not limited to, evaporation masks, screening masks, stencils, and the like. The molybdenum masking layer 20 is coated with photo resist layers 30. The molybdenum layer 20 is etched within an etch bath using an aqueous solution of potassium ferricyanide with sodium hydroxide. During such etching, the ionic byproduct complex created by the reaction between the molybdenum and etchant mixture of potassium ferricyanide with sodium hydroxide is potassium sodium molybdate. Prior to placing the molybdenum masking layer within the etch bath, the etch bath is stabilized by bringing it to a temperature of about 130° F. and adding a sufficient amount of molybdenum material in order to activate the etchant and achieve a potassium sodium molybdate concentration of about 25 grams/liter to about 33 grams/liter, a concentration range that has now been found to be effective in achieving the formation of the significantly reduced size openings of the invention in the molybdenum mask.

While the potassium sodium molybdate byproduct is being monitored and controlled within the etch bath, the activity of the potassium ferricyanide with sodium hydroxide etchant mixture is also being controlled by simultaneously monitoring and controlling the total iron concentration, the oxidation/reduction potential (ORP) and the pH all within this first etch bath during this etch step of etching the fine geometry openings in the molybdenum masking layer. Preferably, the iron concentrations, within this single etch bath, are simultaneously monitored and controlled within limit concentrations of about 25 grams/liter to about 30 grams/liter in order to ensure etchant activity and achieve the required product geometries of masks 100, 200.

In particular, the iron is present within the etch bath at two separate valence levels, ferri and ferro, from the ferricyanide source in the etchant makeup, preferably from the potassium ferricyanide etchant. The etch bath initially starts with an active ferri concentration, however, as the potassium ferricyanide etchant etches the molybdenum masking layer 20, an oxidation reduction process converts any active ferri to inactive ferro. As the etch process continues, and the ferri concentrations are converted to ferro concentrations, therein the etch bath progressively becomes depleted and inactive, the inactive ferro species is converted to the active ferri species by the action of ozone gas which is disseminated through the etchant solution. The ORP of the solution is monitored to determine the etchant activity. Additional etchant solution containing iron is added to the etch bath to maintain iron concentrations in the bath within the limit concentrations of about 25 grams/liter to about 30 grams/liter. If too much additional etchant is added, the etch bath can be diluted by adding a neutral wet agent, such as water, to the bath in an amount sufficient to maintain and control the iron concentrations within about 25 to about 30 grams/liter.

In controlling the etchant activity, the effect of ozone within the etch bath also adjusts the ORP which is a measure of the potential activity of the etchant measured as an electrical measurement millivolts (mV). This ORP is also monitored and controlled within the etch bath ozonating the etchant, thereby extending the life of the moly etchant and reducing the frequency of replacement. It is critical that the ORP be maintained within a limit band of about 330 mV to about 360 mV to effectively control the etch activity to enable formation of the smaller opening geometries of the invention within the masking layer. This is done by introducing ozone, which is an oxidizing agent, into the etch bath. In particular, as the etching of the masking layer 20 proceeds within the etch bath 50, the etch bath is reduced down to ferro and becomes inactive as described above. While the etch process proceeds, the reduction and inactivity of the etch bath is simultaneously reversed and replenished into an active state by introducing ozone into the etchant thereby maintaining the ORP within the limit band.

Thus, it is essential to this invention that the etch bath for forming the reduced features within the masking layer be regenerated in-situ by the simultaneous monitoring and controlling of the byproduct and etchant activity, which, preferably includes monitoring and control a precipitated metal concentration from the etchant, ORP and pH to within the limits.

EXAMPLE 1

Referring to FIGS. 5A–F, in a first example of the preferred embodiment, fine pitch molybdenum evaporation masks 100 are formed having substantially reduced sized openings therein, which, are patterned to correspond to an I/O design on a substrate. Conventional molybdenum mask formation is typically limited to bump geometries of 4.0 mil diameters with a pitch of 9.0 mil centers. However, these dimensions are inefficient as semiconductor technology continues to decrease in size.

Figure 5A:
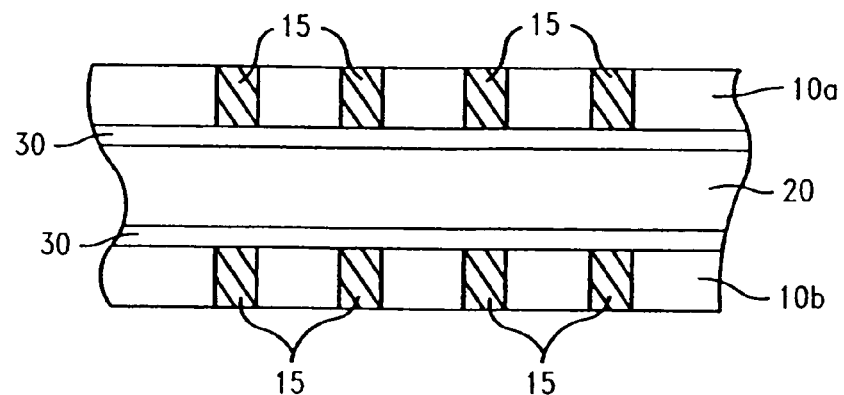
FIGS. 5A–C illustrate side elevational views of the process steps for forming a fine pitch evaporation mask in accordance with the invention having significantly reduced I/O openings and knife-edges within each opening.
Figure 5B:
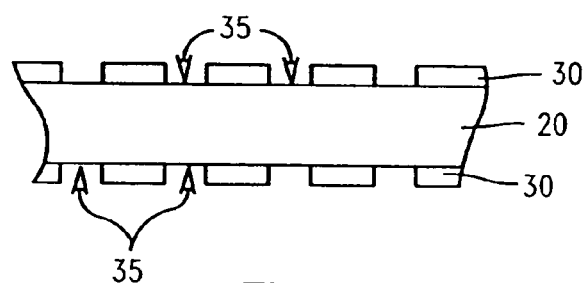
Figure 5C:
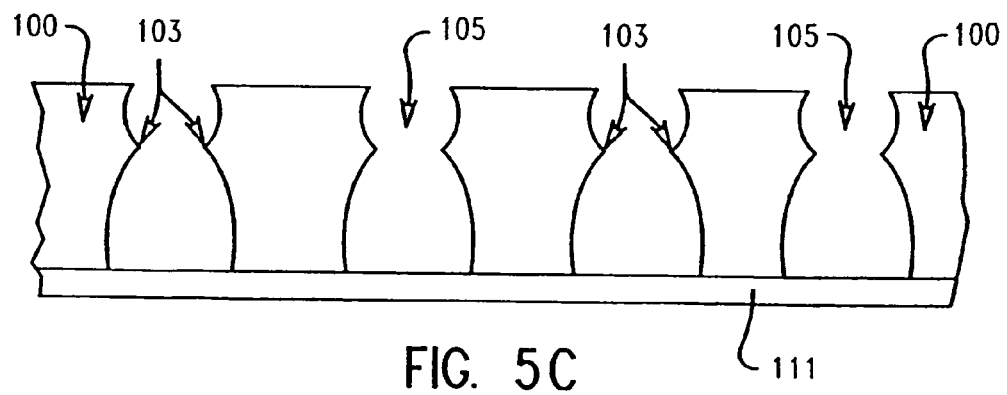
Figure 5D:
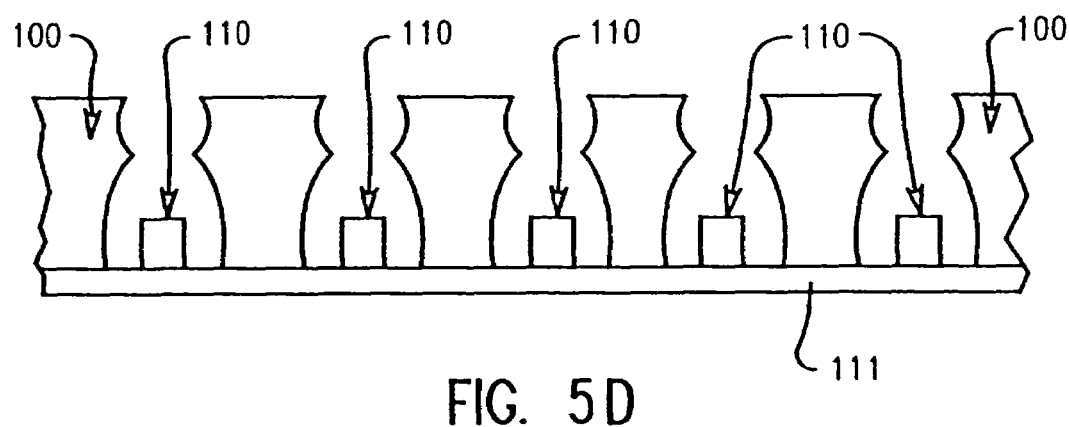
FIG. 5D is a side elevational view illustrating the resultant evaporation mask from FIGS. 5A–C on a substrate having a metal deposited therein the I/O openings to form a plurality of significantly reduced sized electrically conductive bumps on the substrate.
Figure 5E:
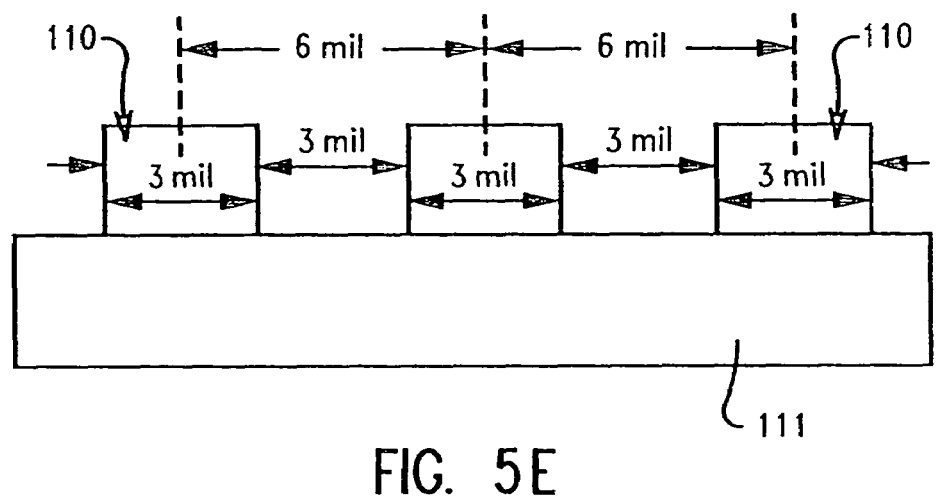
FIG. 5E is a side elevational view illustrating resultant electrically conductive bumps formed on a substrate using the mask of FIG. 5D, the bumps each having a 3 mil diameter on a 6 mil center or pitch.
Figure 5F:
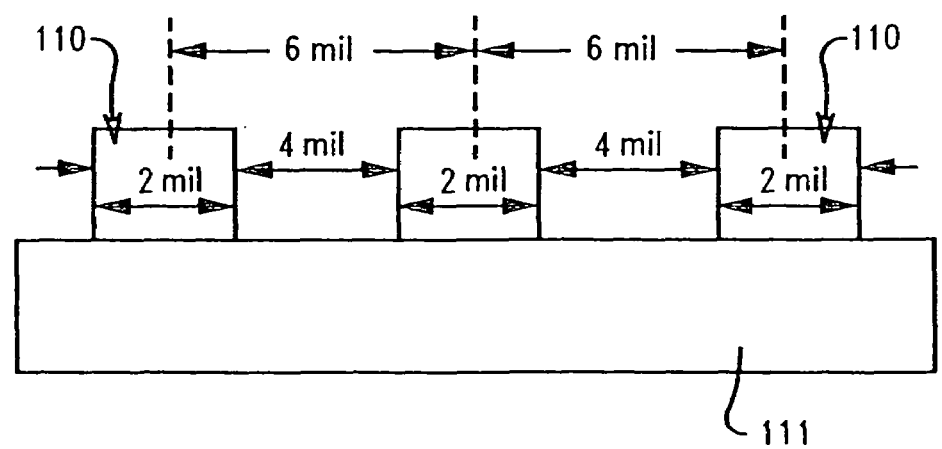
FIG. 5F is a side elevational view illustrating resultant electrically conductive bumps formed on a substrate using the mask of FIG. 5D, the bumps each having a 2 mil diameter on a 6 mil center or pitch.

Therefore, the invention provides for fine pitch molybdenum evaporation masks, and the formation thereof, that enable providing I/O geometries substantially below conventional geometries of 4.0 mil diameters on 9.0 mil centers, preferably down to about 3.0 mil diameters on about 6.0 mil centers as shown in FIG. 5E, or even 2.0 mil diameters on about 6.0 mil centers as shown in FIG. 5F, while still maintaining the integrity of the resultant fine pitch molybdenum evaporation masks and wafer bumps formed using such masks. I/O and bump geometries realized in accordance with this invention include, but are not limited to, about 2.0 mil diameters with about 6.0 mil centers on about a 1.4 mil thick mask, about 3.0 mil diameters with a 6.0 mil center on about a 2.6 mil thick mask and about a 3.3 mil diameter with a 6.0 mil center on about a 3.0 mil thick mask. In the preferred embodiment, the fine pitch molybdenum evaporation masks have a plurality of I/O features for forming bumps 110, each having about a 2.0 mil diameter with a 6.0 mil center, on a substrate 111, whereby, substantially in excess of 1,000,000 of these I/Os, that are within about a +/−0.5 mil tolerance as determined on automated inspection equipment as known and used in the art, may be provided on the substrate as a result of the reduced geometries of the invention.

The fine pitch molybdenum evaporation masks are formed on semiconductor substrates 111 that serve as C4 defining masters during semiconductor wafer bumping. These fine pitch molybdenum masks enable a substantial reduction in I/O pitch of the I/O features 105 within the resultant mask 100, while simultaneously maintaining knife-edges 103 extending from about 2.5 micron to about 7.5 micron toward the center of the I/O feature, thereby protecting end-use evaporation processes. The maintaining of the knife-edge 103 in the fine pitch molybdenum mask is essential to the invention as it ensures that wafer-shielding properties, with respect to evaporative materials of the resultant mask, are not diminished. Thus, the requirements of the fine pitch masks necessitate improved image formation and mask knife-edge control to achieve the reduced geometry I/O properly etched into the masking layer, while significantly reducing process variations from substrate to substrate. Advantageously, the reduced geometries realized by this invention, and tolerances associated therewith, enable the reduction of I/O pitch of the mask, which in turn, substantially doubles wafer I/O density. These masks realize the benefits that the resultant mask is easily removed from the substrate surface, post-deposition, without damaging any deposited metallurgy on the substrate.

In forming the resultant fine pitch evaporation mask 100, the uniquely modified glass masters 10a,b, as described above and shown in FIG. 5A, having a plurality of openings 15 therein, are used in forming I/O opening feature 35 within an exposed photo-resist 30 residing over front and back surfaces of the masking layer. The openings within the glass masters are substantially reduced or undersized to enable the formation of the mask and bump geometries down to the substantially reduced geometries of about 3.0 mil diameters with about a 6.0 mil pitch or about 2.0 mil diameters with about a 6.0 mil pitch, as shown in FIGS. 5E and 5F. The openings 15 in the glass masters 10a,b are reduced by adjusting a standard windage calculation as discussed above. For example, a standard glass master I/O diameter for formation of a standard mask having a 4.0 mil I/O diameter with a 9.0 mil center on a 3.8 mil thick mask is a glass master I/O diameter of about 2.1 mils. In order to achieve the desired, reduced I/O diameters and centers of the invention, the glass master I/O is significantly reduced to a diameter of about 1.4 mil thereby providing a mask having a 3.3 mil I/O diameter with a pitch or center of 6.0 mils on about a 3.0 mil thick mask.

A photo resist layer 30 is provided over surfaces of the molybdenum masking layer. The photo resist preferably comprises a positive, liquid, thin film resist deposited by immersing the masking layer into a photo resist reservoir and controlling the rate of withdrawal of the masking layer in order to monitor the thickness of the photo resist layer deposited thereon. The resist layer may be provided to a thickness ranging from about 4.0 μm to about 5.0 μm, preferably to about 4.5 μm, on both front and back surfaces of the masking layer 20. A critical feature of the invention is that any delay time in drying the photo resist is substantially avoided by immediately drying the resist layers after deposition using known techniques, such as drying the resist layers using an IR heater, to form substantially uniform resist layers, which are essential in the subsequent formation of I/Os having reduced feature geometries within the masking layer 20. It has now been found that drying the resist immediately after deposition reduces any film thickness variation by up to at least about 50%, or more, as compared to conventional resist deposition techniques that employ a delay between deposition of the photo resist layer and drying thereof.

The undersized I/O opening features 10a,b within the glass masters are then transferred into the photo resist layers as shown in FIG. 5B, which are then transferred into the masking layer 20 as shown in FIG. 5C to form I/O openings 105 having significantly reduced geometries in mask 100. In so doing, the glass masters 10a,b, having the reduced openings therein, are provided over both surfaces of the masking layer having resist thereon whereby the glass masters are aligned using alignment aids or verniers so that the openings 15 of the same size on masters 10a,b are aligned as closely as possible to each other. The use of the alignment aids or verniers reduces any variation in I/O diameter of the mask 100 while also enabling repeatable precision in the alignment of the glass masters to each other, which effectively improves image formation of the individual I/O images, resulting in increased uniformity of diametric measurements taken over 360 degree images of the individual I/Os. The photo resist layers 30a,b on both surfaces of the substrate are then simultaneously exposed thereby transferring the I/O features directly into resist layers residing on both surfaces of the substrate to form openings 35 in the resist layer as shown in FIG. 5B.

After the photo resist layers 30 are developed, the masking layer 20 with developed resist thereon is introduced into the first etch bath 50 to form openings 35 into the masking layer 20 for forming openings of substantially reduced geometries and well defined knife-edges 103 therein, i.e., the plurality of I/O openings 105 of mask 100. The masking layer 20 is provided within the stabilized first etch bath 50 to effectively control the etch activity to enable formation of the smaller I/O geometries of the invention. This etch bath 50 has a temperature of about 130° F., an etchant of potassium ferricyanide with sodium hydroxide, a potassium sodium molybdate byproduct concentration of about 25 grams/liter to about 33 grams/liter, a total iron concentration within the etchant of about 25 grams/liter to about 30 grams/liter, an ORP within the etchant of about 330 mV to about 360 mV and a pH of 12.0 to 12.8.

The molybdenum masking layer is etched under the above controlled conditions within etch bath 50 for an extended time, which is substantially greater than typical etch times as determined by the metal thickness and mask opening geometry. Conventional etch times have been kept to a minimum in order to retain the efficiency of the mask manufacturing process, however, it has now been found that these conventional etch times undesirably degrade knife-edges of the I/O for reduced geometries, thereby creating less than desirable bumps. In accordance with the invention, it has advantageously been found that by extending the etch times over that which is commonly known in the art, the finer pitch I/Os, and knife-edges associated therewith, may be formed to produce smaller generations of semiconductor and IC technology. By extending the etch time of the molybdenum masking layer 20, precision and control in creating each fine pitch I/O is increased by 50% while preserving knife-edges within each I/O.

In this first example of forming evaporation masks of the preferred molybdenum material, this etch step within etch bath 50 comprises an initial coarse etch in forming the molybdenum evaporation masks 100 having reduced sized I/O features. In particular, this initial coarse etch must be stopped at a pre-finished value image size, i.e., to an image size or diameter set slightly smaller or undersized than the desired size of the reduced I/O features so that a subsequent fine tuning etch step may be performed to further slowly etch the I/Os in order to achieve the final, desired reduced geometry I/Os within the mask. In this initial coarse etch within etch bath 50 to form the pre-finished or undersized I/Os within the masking layer includes regenerating the etch bath and etchant in-situ by simultaneous monitoring and controlling byproduct molybdate concentrations, iron concentrations, ORP and ozone to within the limits. This controls both the consistent vertical and horizontal initial etching of the masking layer.

After the pre-finished or undersized I/Os are formed in the masking layer in the first etch bath 50 (FIG. 3), the masking layer is removed from the first etch bath 50 and inspected to determine the duration required for the fine-tuning etch step after stripping of the photoresist, as well as to determine whether the initial etching step has exceeded the desired image size, i.e., has over-etched the I/Os. This may be accomplished using an automated optical inspection (AOI) system capable of rapid inspection of evaporation masks and calculation of the distribution of I/O image size for 100% of the functional features present in the design. The AOI inspection tool determines the relationship of image size distribution as compared to specification limits, and then calculates the required duration of a second further fine etch step within a second etch bath 60 for achieving the final, desired fine pitch, fine diameter I/O as required by the desired design specification. Those masking layers that are determined to have I/Os that have been over-etched can be discarded thereby providing more efficient and effective mask fabrication processing operations.

Those masking layers having I/O opening features therein that have passed inspection are then transferred into the second etch bath 60 (FIG. 4) for additional low-speed micro, fine etching. This low-speed micro etch fine tunes the achieved pre-finished feature size I/O down to the endpoints of specification requirements, or to the desired, final reduced image sizes of the I/Os within the fine pitch molybdenum masks for C-4 evaporation usage. The final micro etching step is then performed on these masking layers that have passed inspection. In so doing, the patterned photo resist 30 on surfaces 20a,b of the masking layer 20 are removed and then the masking layer having the pre-finished image size I/Os therein is completely immersed into the second etch bath 60.

The second etch bath 60 includes etching these pre-finished I/O features using a low-speed micro-etch of an etchant-capable of low rate attack on the selected material of the masking layer. In the preferred embodiment, the I/O features within the molybdenum masking layer are micro etched using an aqueous solution of sodium persulfate and sodium hydroxide which is an oxidizing agent capable of low rate attack upon the elemental molybdenum to form the resultant fine pitch molybdenum evaporation mask. Any potential reduction in the thickness of the resultant mask as a result of this micro-etch step has been found to be insignificant, and to have no deleterious effect upon the functioning of the finished masks, and may be compensated for in the choice of the initial mask thickness.

Further, this micro-etch step adjusts I/O knife-edges so as to achieve an increase of I/O image size on the order of about 0.1 to about 0.2 mils. In this manner, the entire I/O image size distribution may be brought within specification endpoints without compromising knife-edge requirements. As shown in FIGS. 5C–D, the I/Os 105 each have knife-edges 103 that include small points extending into the center of each I/O image 105 so as to form a cusp within the openings 105, preferably at the middle of the thickness of the openings. These pointed knife-edges 103 are critical to the instant smaller geometry I/Os of the invention as they allow metallurgy to be deposited within the I/Os below the pointed portions of the knife-edges whereby the metallurgy is deposited onto the substrate 111 without contacting the bottom and top portions of the sidewalls within each I/O as shown in FIG. 5D. That is, these knife-edges 103 advantageously prevent any deposited metallurgy from contacting sidewalls within the openings in the mask. This is crucial as the mask may now be readily removed from the substrate 111 without damaging the deposited metallurgy or the mask 100. Optionally, the removed mask 100 may then be reused for further depositing metallurgy onto another substrate.

Referring to FIGS. 5C–D, once the fine pitch molybdenum mask is complete, a metal such as lead/tin solder may be sputter or evaporation deposited within the I/Os 105 of mask 100 to form bumps 110, preferably for use in C4 circuit fabrication, on a substrate 111. In removing the mask 100 from the surface of the substrate 111, these bumps 110 are substantially undamaged as a result of knife-edges 103 within each I/O 105 of mask 100. As shown in FIGS. 5E and 5F, the significantly reduced bump geometries are achievable as a result of the significantly reduced I/O 105 geometries of the invention.

Thus, in this first example, a fine pitch, fine diameter I/O evaporation mask 100 may be formed by initially etching a masking layer using a first coarse etch down to pre-finished I/O image sizes and then further fine-tuning these pre-finished openings using a second micro etch that attains a desired fine pitch, fine diameter I/O as required by a design specification. This process advantageously provides increased flexibility for chip interconnection options and reduces process costs.

In a second example of the preferred embodiment of forming molybdenum masks, fine line molybdenum screening masks 200 are formed having substantially reduced sized openings therein, which are patterned to correspond to a line pattern on an IC package. Typical line patterns achieved using conventional methods of mask fabrication range from a low end of about 80 μm or even greater. However, the instant invention enables the fabrication of fine line screening masks having substantially reduced line patterns having geometries as low as about 68 μm, or even lower, for use in multi-layer ceramic packaging.

Figure 6:
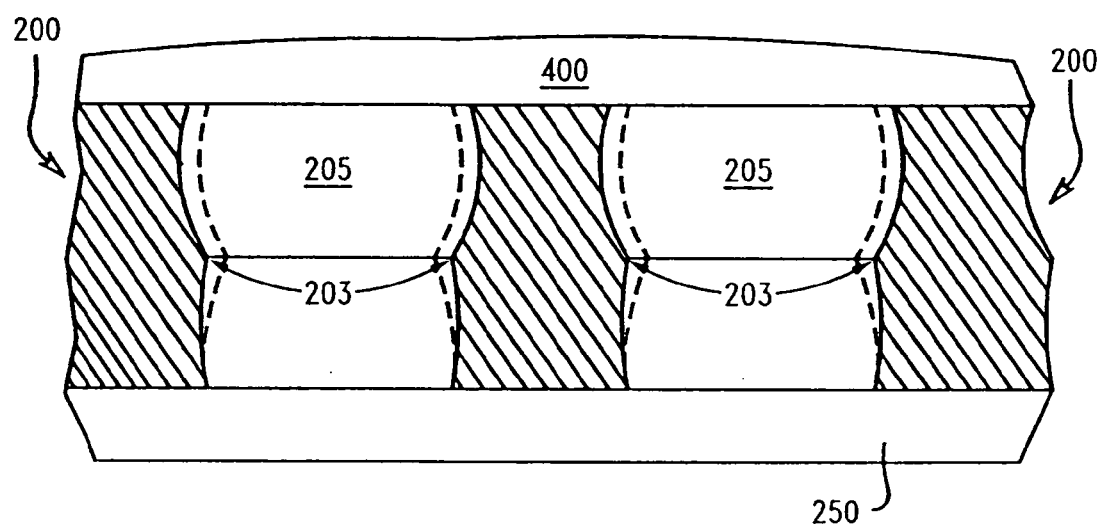
FIG. 6 illustrates a side elevational view of a fine line screening mask in accordance with the invention having significantly reduced patterned line images.

Referring to FIG. 6, fine line molybdenum screening masks 200 are formed using the uniquely modified glass masters 10a,b, photolithography and etching steps. Initially, the glass masters 10a,b for forming the fine line molybdenum screening masks 200 are modified and manufactured as described above. These glass masters are provided with the plurality of openings therein for forming line patterns and interconnection vias in the instant fine line screening masks 200 that correspond to a desired design feature in advanced circuit geometries.

In forming the fine line screening masks 200, the first glass master is secured to the bottom of the masking layer and a second glass master is secured to a top of the masking layer. As shown in FIG. 2, in order to form these smaller geometry lines, it is critical that the line openings in the first glass master are different in size from the openings in the second glass master. In more detail, the line pattern in the first glass master attached to the bottom of the masking layer, which once complete will be attached to the green-sheet 250, is provided with fine line geometries smaller in dimension than the line geometries in the second glass master attached to the top of the masking layer.

In forming the fine line molybdenum screening masks, a photo resist layer is provided over surfaces of the molybdenum masking layer as described above, the line patterns in the glass masters is transferred into the resist layers to form openings therein the resist layers and then the glass masters are removed from the masking layer. The masking layer having the developed resist, with openings therein corresponding to the openings of the glass masters (as shown in FIG. 2), on surfaces thereof is then provided within the etch bath 50 for transferring the developed images into the masking layer to create the resultant fine line molybdenum screening masks 200.

Preferably, the molybdenum masking layer having exposed resist on surfaces thereof is provided within the stabilized etch bath at a temperature of about 130° F. having a potassium ferricyanide with sodium hydroxide etchant mixture, a potassium sodium molybdate byproduct concentration of about 25 grams/liter to about 33 grams/liter, an iron concentration within the etchant of about 25 grams/liter to about 30 grams/liter, and an ORP within the etchant of about 330 mV to about 360 mV, and a pH of about 12.0 to 12.8 to effectively control the etch activity to enable formation of the smaller line geometries of this example of the invention. The molybdenum masking layer is then etched in this etch bath 50 for the extended period of time as required by the respective mask thickness, whereby the fine line patterns formed in this molybdenum masking layer are etched to completion, i.e., to the desired line image as required by the advanced package design.

That is, in accordance with forming the screening masks 200 of the invention, this first etch bath 50 completely etches the fine line openings 205 within the masking layer to form the fine line molybdenum screening mask 200 as shown in FIG. 6, i.e., a further micro-etch step is not necessary. This single etch step within etch bath 50 for forming the fine line screening masks meets desired specification endpoints without compromising knife-edge requirements. Advantageously, the single etch step of this embodiment of the invention, maintains any knife-edge formed within the openings 205 substantially to a maximum dimension. This maximum dimension is defined as that amount that any potential knife-edge 203 extends toward a center of openings 205. In accordance with the invention, any potential knife-edges within openings 205 are maintained to the maximum dimension ranging from about 0.0 micron to about 2.5 micron. The dimensions of any potential knife-edge within the openings 205 advantageously allows for the efficient transfer of conductive metal paste 400 through the mask 200 onto the green sheet 250 for fabrication of electronic circuits. Thus, upon completion of this fine line molybdenum screening mask 200, the mask may be used for screening metal paste 400 onto the green sheet 250 for forming an IC package having a desired line pattern that meets specification limits for use in future generations of IC technologies.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

The invention claimed is:

1. A method of forming a mask for deposition of electrically conductive materials in a desired pattern on areas of a substrate comprising:
   providing a masking layer comprising a material;
   providing a first resist layer on a first surface of said masking layer;
   providing a second resist layer on a second surface of said masking layer;
   providing a first and a second glass master each having at least one opening therein of significantly reduced size;
   securing said first glass master to said first surface of said masking layer having said first resist layer;
   securing said second glass master to said second surface of said masking layer having said second resist layer, said first and second glass masters being substantially in alignment;
   transferring said at least one opening of significantly reduced size of each said first and second glass masters respectively into said first and second resist layers by exposing and developing said resist layers;

etching said masking layer within a first etch bath using an etchant to form at least one opening within said masking layer that represents said pattern on areas of said substrate whereby said material and said etchant react to form a byproduct within said first etch bath, said at least one opening being of a significantly reduced size; and during said etching, simultaneously monitoring and controlling activity of said etchant while monitoring and controlling a concentration of said byproduct within said first etch bath so as to control etching of said at least one opening in said masking layer to form said mask.

2. The method of claim 1 further including, prior to providing said masking layer into said first etch bath, the steps:

activating said first etch bath by adding a sufficient amount of additional said material so as to form an initial concentration of said byproduct within said first etch bath;

monitoring and controlling said initial concentration of said byproduct within said first etch bath; and monitoring and controlling said etchant activity.

3. The method of claim 1 wherein said monitoring and controlling of said etchant activity includes monitoring and controlling properties of said first etch bath selected from the group consisting of an etch bath metal concentration, oxidation/reduction potential, temperature and pH.

4. The method of claim 3 wherein said temperature is maintained and controlled to a range from about 128° F. to about 133° F., while said pH is maintained and controlled to a range from about 12.0 pH to about 12.8 pH.

5. The method of claim 1 wherein said at least one opening of said first glass master comprises a same size as said at least one opening of said second glass master.

6. The method of claim 1 wherein said at least one opening of said first glass master comprises a different size as said at least one opening of said second glass master.

7. The method of claim 1 further including the steps:

removing said first and second glass masters; and providing said masking layer having said developed first and second resist layers each having said significantly reduced size openings within said first etch bath to transfer said openings of said first and second resist layers into said masking layer, wherein during said etching, said step of monitoring and controlling said concentrations of said byproduct within said first etch bath controls a significantly reduced geometrical dimension of said at least one opening within said masking layer.

8. The method of claim 7 wherein said mask comprises a screening mask.

9. The method of claim 1 wherein said masking layer is etched in said first etch bath for an extended time, said extended time ranging from about 25% to about 65% greater than a conventional etch time based on a proportional relationship between a dimension of a desired opening diameter and a thickness of said masking layer.

10. The method of claim 1 wherein said first etch bath comprises an initial coarse etch step for forming said at least one opening in said masking layer while maintaining a knife-edge within said opening, said at least one opening having a pre-finished image size dimension.

11. The method of claim 10 further including, after coarsely etching said at least one significantly reduced opening of pre-finished image size, the steps:

removing said masking layer from said first etch bath;

removing said first and second developed resist layers from said first and second surfaces of said masking layer; and immersing said masking layer into a second etch bath for micro-etching said at least one opening of pre-finished image size to a final image size of said at least one opening for forming said mask.

12. The method of claim 11 wherein said mask comprises an evaporation mask.

13. A method of forming a mask for deposition of electrically conductive materials in a desired pattern on areas of a substrate comprising:

providing a masking layer comprising a material, wherein said material of said masking layer comprises a metal selected from the group consisting of molybdenum, tungsten, niobium, stainless steel, alloys and combinations thereof;

etching said masking layer within a first etch bath using an etchant to form at least one opening within said masking layer that represents said pattern on areas of said substrate whereby said material and said etchant react to form a byproduct within said first etch bath, said at least one opening being of a significantly reduced size; and during said etching, simultaneously monitoring and controlling activity of said etchant while monitoring and controlling a concentration of said byproduct within said first etch bath so as to control etching of said at least one opening in said masking layer to form said mask.

14. A method of forming a mask for deposition of electrically conductive materials in a desired pattern on areas of a substrate comprising:

providing a molybdenum masking layer;

providing a patterned first and a patterned second resist layer respectively over a first surface and a second surface of said molybdenum masking layer, said patterned first and second resist layers each having a plurality of openings therein of significantly reduced geometrical dimensions;

etching said molybdenum masking layer having said patterned first and second resist layers thereon in a first etch bath using an etchant whereby a byproduct is formed between said molybdenum masking layer and said etchant; and during said etching, monitoring and controlling concentrations of said byproduct within said first etch bath while simultaneously monitoring and controlling activity of said etchant to regenerate said first etch bath in-situ to transfer said plurality of openings of significantly reduced geometrical dimensions into said molybdenum masking layer, said plurality of openings of significantly reduced geometrical dimensions in said molybdenum masking layer representing said pattern on areas of said substrate to form said mask.

15. The method of claim 14 wherein said etchant comprises potassium ferricyanide with sodium hydroxide, said byproduct comprises potassium sodium molybdate monitored and controlled to concentrations ranging from about 25 grams/liter to about 33 grams/liter.

16. The method of claim 15 wherein said activity of said potassium ferricyanide with sodium hydroxide etchant is monitored and controlled by monitoring and controlling a total iron concentration within said etch bath to a range from about 25 grams/liter to about 30 grams/liter while simultaneously monitoring and controlling an oxidation/reduction potential and a pH of said first etch bath.

17. The method of claim 14 wherein said plurality of openings of significantly reduced geometrical dimensions in said molybdenum masking layer are etched to a final image size within said first etch bath.

18. The method of claim 14 wherein said plurality of openings within said masking layer are selected from the group consisting of vias, I/Os, lines, channels, and combinations thereof.

19. The method of claim 14 wherein said masking layer is etched in said first etch bath for an extended time, said extended time ranging from about 25% to about 65% greater than a conventional etch time based on a proportional relationship between a dimension of a desired opening diameter and a thickness of said masking layer.

20. The method of claim 14 wherein said first and second resist layers are uniformly deposited over said first and second surfaces of said molybdenum masking layer by substantially immediately drying said first and second resist layers after deposition thereof.

21. The method of claim 14 wherein during said etching step, any knife-edges formed within said plurality of openings are maintained to substantially a maximum dimension ranging from about 0.0 micron to about 2.5 micron.

22. The method of claim 14 wherein said first etch bath comprises an initial coarse etch step for forming said openings in said masking layer having a pre-finished image size, the method further including the steps:

removing said molybdenum masking layer having said pre-finished image size openings therein from said first etch bath;

removing said patterned first and second resist layers from said first and second surfaces of said molybdenum masking layer;

immersing the entire molybdenum masking layer into a second etch bath using a second etchant for micro-etching said pre-finished image size openings to a final image size that corresponds to said pattern on areas of said substrate to form said mask.

23. The method of claim 22 wherein said second etchant comprises an aqueous solution of sodium persulfate and sodium hydroxide.

* * * * *